(12) United States Patent
Nagasawa et al.

(10) Patent No.: US 11,426,970 B2
(45) Date of Patent: Aug. 30, 2022

(54) LAMINATED UNCURED SHEET

(71) Applicant: KYOCERA Corporation, Kyoto (JP)

(72) Inventors: Tadashi Nagasawa, Soraku-gun (JP); Satoshi Yoshiura, Soraku-gun (JP); Chie Chikara, Kyotanabe (JP); Satoshi Kajita, Ikoma (JP); Yasuhide Tami, Aira (JP)

(73) Assignee: KYOCERA CORPORATION, Kyoto (JP)

( * ) Notice: Subject to any disclaimer, the term of this patent is extended or adjusted under 35 U.S.C. 154(b) by 0 days.

(21) Appl. No.: 17/254,881

(22) PCT Filed: Jun. 20, 2019

(86) PCT No.: PCT/JP2019/024552
§ 371 (c)(1),
(2) Date: Dec. 22, 2020

(87) PCT Pub. No.: WO2020/004229
PCT Pub. Date: Jan. 2, 2020

(65) Prior Publication Data
US 2021/0260847 A1 Aug. 26, 2021

(30) Foreign Application Priority Data
Jun. 28, 2018 (JP) .............................. JP2018-123234

(51) Int. Cl.
*B32B 3/26* (2006.01)
*B32B 15/08* (2006.01)
(Continued)

(52) U.S. Cl.
CPC .............. *B32B 3/266* (2013.01); *B32B 15/08* (2013.01); *B32B 27/08* (2013.01); *B32B 27/20* (2013.01); *C08J 5/18* (2013.01); *C08K 3/36* (2013.01); *C08K 5/03* (2013.01); *C08K 13/02* (2013.01); *C09K 21/08* (2013.01); *H05K 1/0373* (2013.01); *B32B 2264/10* (2013.01); *B32B 2307/3065* (2013.01); *B32B 2457/00* (2013.01);
(Continued)

(58) Field of Classification Search
CPC ................................ B32B 3/266; B32B 27/18
USPC ................ 428/131, 132, 133, 134, 135, 136
See application file for complete search history.

(56) References Cited

U.S. PATENT DOCUMENTS

| 2009/0242248 | A1* | 10/2009 | Sohn | ....................... B29C 66/45 174/258 |
| 2014/0177192 | A1 | 6/2014 | Lee et al. | |
| 2016/0105958 | A1 | 4/2016 | Nakamura et al. | |

FOREIGN PATENT DOCUMENTS

| FR | 3059201 A1 | 5/2018 |
| JP | 11-186677 A | 7/1999 |

(Continued)

*Primary Examiner* — Zachary M Davis
(74) *Attorney, Agent, or Firm* — Volpe Koenig

(57) ABSTRACT

A laminated uncured sheet of the present disclosure has a structure in which resin sheet layers and resin layers are alternately laminated and a through hole penetrating in the laminating direction is formed, wherein the resin sheet layers are formed with a thermosetting resin composition containing a thermosetting resin as a main component, the resin layers are formed with a thermoplastic resin composition containing a thermoplastic resin, and the thermoplastic resin composition is adhered to the inner wall surface of the resin sheet layer part in the through hole.

8 Claims, 2 Drawing Sheets

(51) Int. Cl.
  *B32B 27/08* (2006.01)
  *B32B 27/20* (2006.01)
  *C08J 5/18* (2006.01)
  *C08K 3/36* (2006.01)
  *C08K 5/03* (2006.01)
  *C08K 13/02* (2006.01)
  *C09K 21/08* (2006.01)
  *H05K 1/03* (2006.01)

(52) U.S. Cl.
  CPC ........ *C08J 2345/00* (2013.01); *C08J 2367/02* (2013.01); *C08J 2425/06* (2013.01); *H05K 2201/0209* (2013.01)

(56) References Cited

FOREIGN PATENT DOCUMENTS

| | | |
|---|---|---|
| JP | 11-243277 A | 9/1999 |
| JP | 2005-136050 A | 5/2005 |
| JP | 2008-103640 A | 5/2008 |
| JP | 2014-127716 A | 7/2014 |

\* cited by examiner

LAMINATED UNCURED SHEET

TECHNICAL FIELD

The present disclosure relates to a laminated uncured sheet, a laminated cured sheet, a metal-clad laminate, and a wiring board.

BACKGROUND ART

In recent years, as the speed and integration of LSIs and the memory capacity have increased, the various electronic components have been rapidly reduced in size, weight, and thickness. In a wiring board or the like used in the field of such electronic components, for example, as described in Patent Document 1, a via hole opening (through hole) is formed, and a via hole is formed by filling the opening with a plating or the like.

PRIOR ART DOCUMENTS

Patent Documents

Patent Document 1: Japanese Unexamined Patent Publication No. H11-243277

SUMMARY OF THE INVENTION

The laminated uncured sheet of the present disclosure has a structure in which resin sheet layers and resin layers are alternately laminated, and a through hole penetrating in the laminating direction is formed, wherein the resin sheet layers are formed with a thermosetting resin composition containing a thermosetting resin as a main component, the resin layers are formed with a thermoplastic resin composition containing a thermoplastic resin, and the thermoplastic resin composition is adhered to the inner wall surface of a resin sheet layer part in the through hole.

The laminated cured sheet of the present disclosure has a structure in which cured resin sheet layers and resin layers are alternately laminated, and a through hole penetrating in the laminating direction is formed, wherein the cured resin sheet layers are formed with a thermosetting resin composition containing a thermosetting resin as a main component, the resin layers are formed with a thermoplastic resin composition containing a thermoplastic resin, and the thermoplastic resin composition is adhered to the inner wall surface of a cured resin sheet layer part in the through hole.

The metal-clad laminate of the present disclosure includes the above-mentioned laminated cured sheet and a metal foil laminated on at least one side of the laminated cured sheet.

The wiring board of the present disclosure has a plurality of insulating layers and conductor layers disposed between the insulating layers, in which the insulating layers are composed of the above-mentioned laminated cured sheets.

EMBODIMENTS FOR CARRYING OUT THE INVENTION

Figure 1:
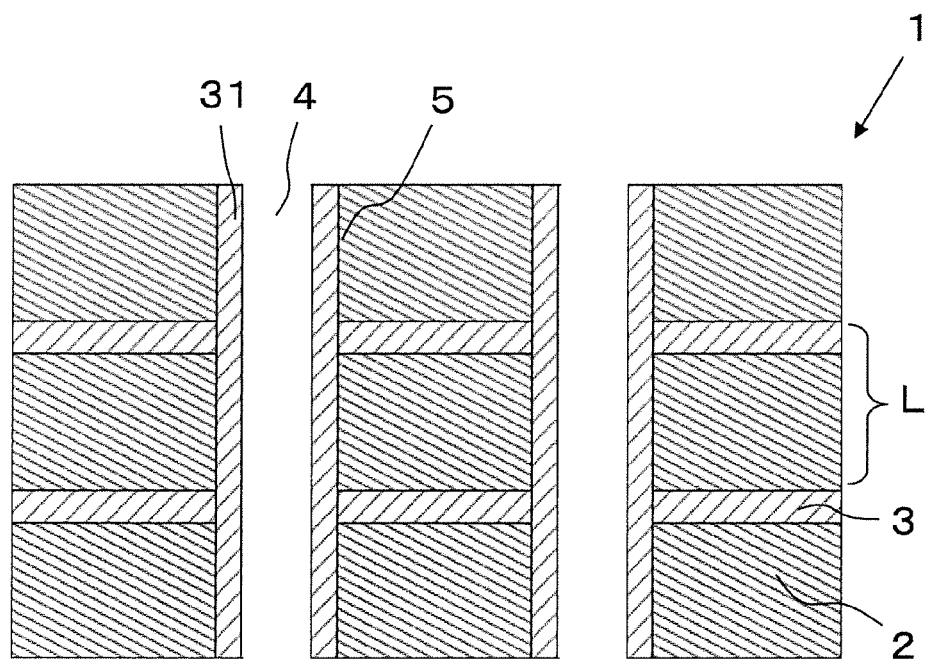
FIG. 1 is a sectional view showing a structure of the laminated uncured sheet according to one embodiment of the present disclosure.

When a through hole is formed in a board, the inner wall surface of the through hole may become uneven and rough. If a plating process is carried out with the roughened inner wall surface of the through hole, the plating solution can easily penetrate into a layer forming the board from the inner wall surface of the through hole. Therefore, a plating metal exists in the layer, which results in poor electrical reliability.

The laminated uncured sheet of the present disclosure has a structure in which resin sheet layers and resin layers are alternately laminated, a through hole penetrating in the laminating direction is formed, and a thermoplastic resin composition is adhered to the inner wall surface of a resin sheet layer part in the through hole. As a result, the unevenness of the inner wall surface of the resin sheet layer in the through hole is filled with a thermoplastic resin and becomes relatively smooth, and the penetration of the plating solution into the resin sheet layer from the inner wall surface of the through hole can be prevented. Therefore, when the laminated uncured sheet of the present disclosure is used as a material for the board, a wiring board with excellent electrical reliability can be obtained. In this case, the inner wall surface of the through hole of a resin sheet layer 2 may be covered with the thermoplastic resin composition.

The laminated uncured sheet of the present disclosure has a structure in which resin sheet layers and resin layers are alternately laminated, and a through hole penetrating in the laminating direction is formed. The resin sheet layers are formed with a thermosetting resin composition containing a thermosetting resin as a main component and is in an uncured or semi-cured state.

The thermosetting resin composition is not limited if it is a composition containing a thermosetting resin as a main component. Examples of the thermosetting resin include a thermosetting cyclic olefin resin, an epoxy resin, a phenolic resin, an amino resin, a thermosetting polyimide resin, or the like.

The cyclic olefin resin is a polyolefin polymer having a cyclic structure, such as a copolymer of a cyclic olefin and other monomers capable of copolymerizing with this cyclic olefin. The ratio of the cyclic olefin to the other monomers is not limited, and for example, the cyclic olefin may contain 10 to 80% by mass and the other monomers may contain 20 to 90% by mass.

The cyclic olefin includes, for example, norbornene monomer, cyclic diene monomer, vinyl alicyclic hydrocarbon monomer, or the like. Specifically, the cyclic olefin includes norbornene, vinyl norbornene, phenylnorbornene, dicyclopentadiene, tetracyclododecene, cyclopropene, cyclobutene, cyclopentene, cyclohexene, cyclohexadiene, cyclooctadiene, or the like. These cyclic olefins may be used alone or in combination with two or more.

Other monomers that can be copolymerized with the cyclic olefin include, for example, chain olefins, acrylic acid, methacrylic acid, acrylic acid esters, methacrylate esters, aromatic vinyl compounds, unsaturated nitriles, aliphatic conjugated dienes, or the like. Specifically, such monomers include ethylene, propylene, butene, acrylic acid, methacrylic acid, fumaric acid, fumaric anhydride, maleic acid, maleic anhydride, methyl acrylate, ethyl acrylate, propyl acrylate, isopropyl acrylate, methyl methacrylate, methacrylic acid ethyl, propyl methacrylate, isopropyl methacrylate, styrene, vinyl toluene, acrylonitrile, methacrylonitrile, 1,3-butadiene, 2-methyl-1,3 Butadiene, 2,3-dimethyl-1,3-butadiene, or the like. These other monomers may be used alone or in combination with two or more.

The amino resin is obtained by the polycondensation of compounds having amino groups with aldehydes. Compounds having amino groups include, for example, urea, melamine, or the like and aldehydes include, for example, formaldehyde or the like. Specifically, the amino resin includes urea resin, melamine resin, or the like.

The thermosetting resin may be used appropriately, depending on the use of the laminated uncured sheet of the present disclosure. For example, if better electrical properties are required of the laminated uncured sheet of the present disclosure, at least one resin selected from the group consisting of a thermosetting cyclic olefin resin and an epoxy resin may be used. On the other hand, if better heat resistance and mechanical strength are required of the laminated uncured sheet of the present disclosure, at least one resin selected from the group consisting of a thermosetting cyclic olefin resin, an epoxy resin, a polyimide resin, a phenolic resin, and an amino resin (such as a urea resin and a melamine resin) may be used. Furthermore, in addition to the above characteristics, considering the low moisture absorption, it is better to use a thermosetting cyclic olefin resin.

The thermosetting resin composition containing a thermosetting resin as a main component is a resin composition that the largest amount of the resin component contained in the thermosetting resin composition is the thermosetting resin. The thermosetting resin composition may include additives, for example, an antioxidant, a UV absorber, a colorant, a base material (such as an inorganic filler, a glass cloth, an aramid nonwoven fabric, and a glass nonwoven fabric), a flame retardant, or the like. In this case, the ratio of the base material and the flame retardant may be 0% or more and 40% or less of the area in the cross-section of the laminated uncured sheet.

The identification of the base material and the flame retardant is carried out by, for example, the following procedure. First, the laminated uncured sheet is cut to a predetermined size (for example, 0.5 mm×0.5 mm). The identification of the base material and the flame retardant can be performed by the same method even if the laminated uncured sheet is replaced with a laminated cured sheet obtained by curing the laminated uncured sheet, a metal-clad laminate, or a wiring board using this laminated cured sheet. Next, the cross-section of the cut laminated uncured sheet is observed and photographed with a scanning electron microscope. A digital microscope may be used instead of the scanning electron microscope. The range for photography, for example, is about 100 to 150 μm in height and 100 to 150 μm in width. An area to be photographed may be only one location of any part.

Next, the base material and the flame retardant are identified based on the photographs taken. In the case of scanning electron micrographs, the resin component, the base material, and the flame retardant are identified by an analyzer (electron probe microanalyzer (EPMA)) attached to the scanning electron microscope. In this case, the base material and the flame retardant are identified from the included inorganic elements (such as Si and Br). The resin component is the part that does not include the above elements in the base material and the flame retardant. The identification of the resin component, the base material, and the flame retardant can also be distinguished from each other based on the differences in coloration that appear in the photographs, after identifying the elements. Thus, the parts of the photograph that are similar in color to the identified resin component, base material, and flame retardant are identified as the resin component, the base material, and the flame retardant, respectively. From the areas of the identified base material and flame retardant, the area of each can be determined.

The thermosetting resin composition may contain at least one of the inorganic filler or the flame retardant in order to improve the flame resistance of the laminated uncured sheet. The inorganic filler is not particularly limited, and it includes, for example, silica, talc, mica, clay, calcium carbonate, titanium dioxide, barium titanate, carbon black, glass beads, glass hollow spheres, or the like. Examples of silica include crushed silica, fused silica, or the like, which may be used alone or in a mixture of two or more. The mean particle diameter of the inorganic filler is not particularly limited, and for example, it may be 0.01 μm or more and 10 μm or less and 0.5 μm or more and 3 μm or less.

The flame retardant is not particularly limited, and it includes, for example, melamine phosphate, melam polyphosphate, melem polyphosphate, melamine pyrophosphate, ammonium polyphosphate, red phosphorus, aromatic phosphate ester, phosphonate ester, phosphinic acid ester, phosphine oxide, phosphazene, melamine cyanolate, ethylene bis-pentabromobenzene, ethylene bistetrabromophthalimide, or the like. These flame retardants may be used alone or in combination with two or more. In this case, a brominated flame retardant (such as ethylene bis-pentabromobenzene and ethylene bis-tetrabromophthalimide) may be used from the viewpoint of lowering the dielectric dissipation factor of the laminated cured sheet obtained by curing the laminated uncured sheet. The mean particle diameter of the flame retardant is not particularly limited, and for example, it may be 0.01 μm or more and 10 μm or less and 0.5 μm or more and 3 μm or less.

The resin layer is formed with a thermoplastic resin composition including a thermoplastic resin and is in an uncured or semi-cured state. The thermoplastic resin composition is not limited if the composition includes the thermoplastic resin. Examples of the thermoplastic resin include a polystyrene resin, a phenylene resin, a Teflon (registered trademark) resin, a liquid crystal polymer, or the like because of their excellent adhesion to the resin sheet layer and their resistance to solid solution.

The thermoplastic resin composition including a thermoplastic resin means, specifically, a composition including 5% by mass or more of the thermoplastic resin, and it may include 10% by mass or more of the thermoplastic resin. The thermoplastic resin composition may include at least one additive selected from the group, such as, the above-mentioned thermosetting resin or the above-mentioned antioxidant and base material (for example, an inorganic filler, a glass cloth, an aramid nonfabric, a glass nonfabric, or the like). In particular, when the thermosetting resin is included in the thermoplastic resin composition, the adhesion between the resin sheet layer and the resin layer can be enhanced.

The laminated uncured sheet of the present disclosure is alternately laminated with resin sheet layers and resin layers. The structure of the laminated uncured sheet according to one embodiment is described based on FIG. 1. A laminated uncured sheet 1, shown in FIG. 1, has a five-layer structure in which three-layer resin sheet layers 2 and two-layer resin layers 3 are alternately laminated. Although the laminated uncured sheet 1 shown in FIG. 1 has a five-layer structure, the laminated uncured sheet of the present disclosure is not limited to the five-layer structure.

The laminated uncured sheet 1 is formed with a through hole (through hole) 4 penetrating from the upper surface to the lower surface. In this case, a thermoplastic resin composition 31 may cover at least an inner wall surface 5 of the resin sheet layer 2 part in the through hole 4.

When the through hole 4 is formed in the resin sheet layer 2 including the thermosetting resin composition described above, the inner wall surface of the formed through hole 4 tends to be rough. In this case, a plurality of concave parts is formed on the inner wall surface 5 of the through hole 4. The thermoplastic resin composition 31 is adhered so as to fill these concave parts. The thermoplastic resin composition 31 adhered to the inner wall surface 5 of the through hole 4 has a plurality of streaks formed in the direction of penetrating the through hole 4. The streaks have an anchor effect on the plated metal formed in the through hole 4. As a result, the adhesive strength between the thermoplastic resin composition 31 and the plated metal formed in the through hole 4 can be increased.

The thickness of the resin sheet layer 2 and the resin layer 3 is not particularly limited, and for example, the thickness of the resin layer 3 may be thinner than the thickness of the resin sheet layer 2. In view of the fact that the inner wall surface of the resin sheet layer 2 part is easily covered with the thermoplastic resin composition forming the resin layer 3 in the through hole 4, and in consideration of heat resistance, the thickness of the resin layer 3 may be 4 to 14 in a relative value when the thickness of the resin sheet layer 2 is set to 100. In this case, it is needless to say that it can also be applied to those formed by the resin sheet layer 2 and the resin layer 3 having different thicknesses, respectively, as the laminated uncured sheet. The thickness of the resin layer 3 is not particularly limited, and for example, it may be 0.5 µm or more and 3 µm or less. If the thickness of the resin layer 3 is 0.5 µm or more, the adhesion between the resin sheet layer 2 and the resin layer 3 can be further improved. On the other hand, when the thickness of the resin layer 3 is 3 µm or less, the rigidity of the laminated cured sheet obtained by curing the laminated uncured sheet 1 is more rigid and less likely to bend, and the heat resistance can be further improved. Regarding the laminated cured sheet obtained by curing the laminated uncured sheet 1, the thickness of the resin layer may also be 4 to 14 in a relative value when the thickness of the cured resin sheet layer is set to 100.

Figure 2:
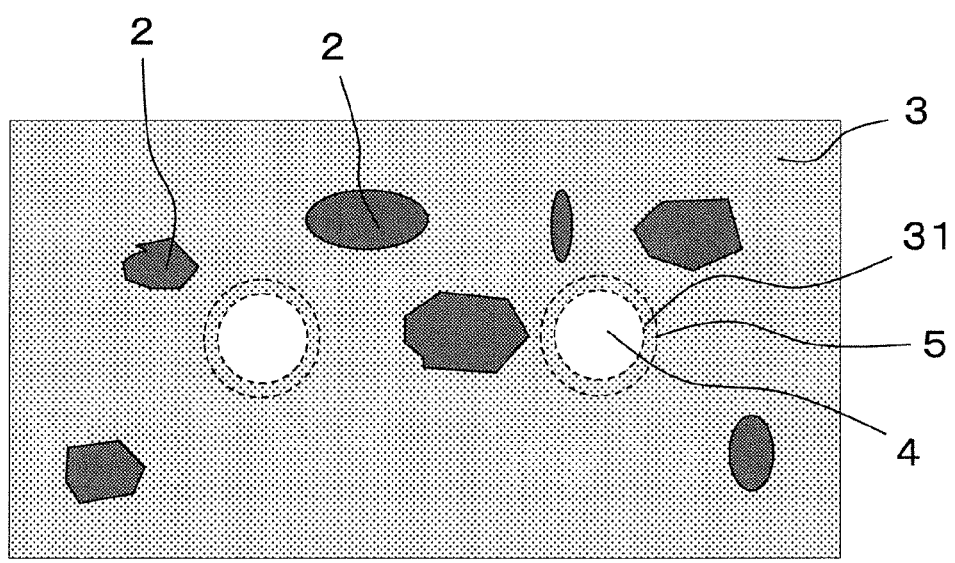
FIG. 2 is a top view showing one embodiment of the layer L part of the laminated uncured sheet in FIG. 1.

It is not necessary for the resin layer 3 to cover the entire main surface of the resin sheet layer 2. For example, as shown in FIG. 2, there may be a part where the resin sheet layer 2 is not covered with the resin layer 3. Considering the adhesion between the resin sheet layer 2 and the resin layer 3 or the like, the coverage of the resin layer 3 to the main surface of the resin sheet layer 2 may be 60% or more, may be 90% or more, and of course may be 100%. Furthermore, if the coverage is 60% or more, even if the through hole 4 is formed at any location, the probability of the inner wall surface 5 of the through hole 4 in contact with the resin layer 3 increases, and there is no particular problem in terms of the thermoplastic resin composition 31 covering the inner wall surface 5 of the through hole 4.

At least one of the resin sheet layer 2 or the resin layer 3 may contain at least one of the inorganic filler or the flame retardant agent. That is, at least one of the thermosetting resin composition or the thermoplastic resin composition may contain at least one of the inorganic filler or the flame retardant.

At least one of the resin sheet layer 2 or the resin layer 3 may further include a stress reliever. The stress reliever is not particularly limited, for example, a silicone resin particle or the like. The silicone resin particle includes, for example, KMP-597 (Shin-Etsu Chemical Co., Ltd.) and X-52-875 (Shin-Etsu Chemical Co., Ltd.) as silicone rubber powders and KMP-590 (Shin-Etsu Chemical Co., Ltd.), X-52-1621 (Shin-Etsu Chemical Co., Ltd.), or the like as silicone resin powders. These stress relievers may be used alone or in combination with two or more. The stress reliever may have a mean particle diameter of 10 µm or less. By using the stress reliever having such a mean particle diameter, when the laminated uncured sheet 1 is used in, for example, a metal-clad laminate or the like, the adhesion with the metal foil can be improved.

When at least one of the resin sheet layer 2 or the resin layer 3 contains at least one of the inorganic filler or the flame retardant, the content ratio of the inorganic filler and the flame retardant in the resin layer 3 may be less than the content ratio of the inorganic filler and the flame retardant in the resin sheet layer 2. Specifically, if the content ratio of the inorganic filler and the flame retardant in the resin sheet layer 2 is set to 1, the content ratio of the inorganic filler and the flame retardant in the resin layer 3 may be 0.1 or more and 0.9 or less, and it may also be 0.2 or more and 0.8 or less. If the content ratio of the inorganic filler and the flame retardant in the resin layer 3 is such a ratio, the wettability of the thermoplastic resin composition 31 flowing out of the resin layer 3 for the inner wall surface of the through hole 4 can be further improved when the through hole 4 is formed in the laminated uncured sheet 1. It is needless to say that this case can also be applied to the laminated uncured sheet that is formed by the resin sheet layer 2 and the resin layer 3 having different thicknesses, respectively.

The laminated cured sheet of the present disclosure is obtained by subjecting the above-described laminated uncured sheet to pressurized heat treatment. In this case, the resin sheet layer 2, the resin layer 3, the through hole 4, the inner wall surface 5, and the thermoplastic resin composition 31 in the uncured resin sheet 1 described above correspond to the cured resin sheet layer, the resin layer, the through hole, the inner wall surface and the thermoplastic resin composition in the laminated cured sheet and their reference numerals, respectively. It means that the laminated cured sheet has structure in which cured resin sheet layers and resin layers are alternately laminated and a through hole penetrating in the laminating direction is formed. In this case, the cured resin sheet layer is formed with a thermosetting resin composition containing a thermosetting resin as a main component. The resin layer is formed with a thermoplastic resin composition including a thermoplastic resin. Furthermore, the thermoplastic resin composition is adhered to the inner wall surface of the cured resin sheet layer part in the through hole.

According to the laminated cured sheet, the thermoplastic resin composition is adhered to the inner wall surface of the through hole, so that the thermoplastic resin composition is dissolved by a slight temperature rise when plating or the like is performed on the through hole, and this dissolved thermoplastic resin composition is wetted and spread on the inner wall surface of the through hole. This allows the inner wall surface of the through hole to be covered by the thermoplastic resin composition. As a result, it is possible to avoid the penetration of the plating solution from the through hole to the cured resin sheet layer.

In the case of the laminated cured sheet, the thickness of the resin layer may also be thinner than the thickness of the cured resin sheet layer. In view of the fact that the inner wall surface of the cured resin sheet layer part is easily covered with the thermoplastic resin composition forming the resin layer in the through hole, and in consideration of heat resistance, the thickness of the resin layer may be 4 to 14 in a relative value when the thickness of the cured resin sheet layer is set to 100. In this case, it is needless to say that it can also be applied to those formed by the cured resin sheet layer and the resin layer having different thicknesses, respectively, as the laminated cured sheet. The thickness of the resin layer is not particularly limited, and for example, it may be 0.5 μm or more and 3 μm or less. If the thickness of the resin layer is 0.5 μm or more, the adhesion between the cured resin sheet layer and the resin layer can be further improved. On the other hand, when the thickness of the resin layer is 3 μm or less, the rigidity of the laminated cured sheet obtained by curing the laminated uncured sheet is enhanced, making it more difficult to bend and further improving heat resistance.

Even in the case of the cured resin sheet, it is not necessary for the resin layer to cover the entire surface of the main surface of the cured resin sheet layer. Similar to the structure of the uncured resin sheet described above, for example, as shown in FIG. 2, a part where the cured resin sheet layer is not covered with the resin layer may exist. Considering the adhesion between the cured resin sheet layer and the resin layer or the like, the coverage of the resin layer to the main surface of the cured resin sheet layer may be 60% or more, 90% or more, and, of course, may be 100%. Furthermore, if the coverage is 60% or more, even if a through hole is formed at any location, the probability of the inner wall surface of the through hole in contact with the resin layer increases, and there is no particular problem in terms of the thermoplastic resin composition covering the inner wall surface of the through hole.

At least one of the cured resin sheet layer or the resin layer may contain at least one of the inorganic filler or the flame retardant. That is, at least one of the thermosetting resin composition or the thermoplastic resin composition may contain at least one of the inorganic filler or the flame retardant.

When at least one of the cured resin sheet layer and the resin layer contains at least one of the inorganic filler or the flame retardant, the content ratio of the inorganic filler and the flame retardant in the resin layer is preferably less than the content ratio of the inorganic filler and the flame retardant in the cured resin sheet layer. Specifically, when the content ratio of the inorganic filler and the flame retardant in the cured resin sheet layer is set to 1, the content ratio of the inorganic filler and the flame retardant in the resin layer may be 0.1 or more and 0.9 or less or 0.2 or more and 0.8 or less by mass. If the content ratio of the inorganic filler and the flame retardant in the resin layer is in such a mass ratio, the thermoplastic resin composition can easily flow out of the resin layer to the inner wall surface of the through hole when forming the through hole in the laminated cured sheet, and the wettability is further improved. It is needless to say that this case can also be applied to those formed by the cured resin sheet layer and the resin layer having different thicknesses, respectively, as a laminated cured sheet.

In this case, the content ratio of the inorganic filler in the resin layer (namely, the thermoplastic resin composition) may be less than the content ratio of the inorganic filler in the cured resin sheet layer. The thermoplastic resin in the resin layer is more likely to melt due to the partial temperature rise during the formation of the through hole. On the other hand, in terms of improving the flame resistance of the laminated cured sheet, the cured resin sheet layer (namely, the thermosetting resin composition), which makes up a large portion of the laminated cured sheet, may include more flame retardant. The above-mentioned stress reliever may be further contained in at least one of the cured resin sheet layer or the resin layer.

The methods of producing the laminated uncured sheet of the present disclosure is not particularly limited. It is obtained by alternately laminating the resin sheet layers formed with the above-mentioned thermosetting resin composition and the resin layers formed with the above-mentioned thermoplastic resin composition.

The resin sheet layer is formed, for example, from the thermosetting resin composition (thermosetting resin varnish) containing a solvent. The solvent can be, for example, xylene. In this case, the mass ratio of the solid content (resin component and non-resin component) to the solvent is not particularly limited but is mixed in a mass ratio of about 60:40 to 20:80, for example. In addition to xylene, aromatic solvents such as toluene, benzene, and ethylbenzene, hydrocarbon solvents such as normhexane, cyclohexane, and methylcyclohexane, ketone solvents such as acetone, and other solvents such as tetrahydrofuran and chloroform may be used, or xylene may be used in combination with the other solvents mentioned above.

A sheet-like molded body is then made from the obtained thermosetting resin varnish. Specifically, the thermosetting resin varnish is formed into a sheet form by a bar coater method, a doctor blade method, a die coater method, or the like, and then dried for 1 to 10 minutes at 120 to 150° C. to obtain an uncured sheet-like molded body. The sheet-like molded body may be formed, for example, by an extrusion method or an injection molding method in which the thermosetting resin composition is heated by an extruder or the like.

The resin layer is formed, for example, from the thermoplastic resin composition (thermoplastic resin varnish) containing a solvent. The solvents and the amount of solvents used are described above, and a detailed explanation is omitted. The resulting thermoplastic resin varnish is applied to one main surface of the sheet-like molded body. The main surface applied with the thermoplastic resin varnish is then overlapped with another sheet-like molded body not applied with the thermoplastic resin varnish, resulting in a laminated body having a three-layer structure of the sheet-like molded body/thermoplastic resin varnish/sheet-like molded body. If necessary, the thermoplastic resin varnish is applied to the main surface of another layered sheet-like molded body, and the same process is repeated until the desired number of layers is reached.

Alternatively, the desired number of sheet-like molded bodies applied with the thermoplastic resin varnish may be made and then overlapped. Specifically, the sheet-like molded body may be overlapped so that the main surface applied with the thermoplastic resin varnish and the main surface not applied with the thermoplastic resin varnish are in contact with each other, and finally, another sheet-like molded body not treated with the thermoplastic resin varnish may be overlapped on the main surface applied with the thermoplastic resin varnish to produce a laminated body.

The laminated uncured sheet can be obtained by pressurizing the resulting laminate body, for example, with a pressure of about 0.1 to 1 MPa at room temperature. The laminated uncured sheet of the present disclosure has a thickness of, for example, 0.01 to 2 mm, depending on the number of layers to be laminated.

The laminated cured sheet of the present disclosure is obtained by subjecting the above-described laminated uncured sheet to pressurized heat treatment. The conditions for pressurized heat treatment are, for example, a temperature of 160 to 230° C. and a pressure of 1 to 10 MPa. The laminated cured sheet thus obtained has a thickness of, for example, 0.01 to 2 mm.

The metal-clad laminate of the present disclosure is described next. The metal-clad laminate of the present disclosure has a metal foil on at least one side of the laminated cured sheet of the present disclosure. The metal-clad laminate of the present disclosure is obtained, for example, by overlapping the laminated uncured sheet of the present disclosure and the metal foil and pressurizing and heat-treating it. The conditions for pressurized heat treatment may be similar to those used to obtain the laminated cured sheets described above.

The metal foil is not particularly limited, and includes, for example, a copper foil such as an electrolytic copper foil or a rolled copper foil, an aluminum foil, a composite foil made by overlapping these metal foils, or the like. Among these metal foils, copper foil, for example, is used. The thickness of the metal foil is not particularly limited and is, for example, 5 µm or more and 105 µm or less. The surface roughness of the metal foil is not particularly limited and may be 0.5 µm or less and may be 0.3 µm or less.

The metal-clad laminate of the present disclosure can be obtained by overlapping the desired number of laminated uncured sheets and metal foils of the present disclosure, respectively, and heating and press-molding them. The metal-clad laminate of the present disclosure has, for example, a dielectric dissipation factor of 0.0017 or less. Thus, if the dielectric dissipation factor of the metal-clad laminate is 0.0017 or less, sufficient electrical properties, such as excellent permittivity, can be demonstrated. The metal-clad laminate of the present disclosure is used for a printed wiring board or the like, for example.

The wiring board of the present disclosure is described next. The wiring board of the present disclosure has a basic structure having an insulating layer and a conductor layer disposed on the main surface of the insulating layer. In other words, it comprises a plurality of insulating layers and conductor layers disposed between the insulating layers, in which the insulating layers are formed with the laminated cured sheet of the present disclosure. The main surface of the insulating layer means the surface having the largest area facing each other among the surfaces composing the insulating layer described above, and it is the surface opposite in the thickness direction of the insulating layer. The wiring board of the present disclosure is obtained, for example, by overlapping an inner layer board and a prepreg on which a circuit and a through hole are formed on the metal-clad laminate of the present disclosure, and laminating a metal foil on the surface of the prepreg, and then heating (curing) and press-molding the prepreg. In addition, the circuit and the through hole may be formed on the surface of the metal foil as a multilayer printed wiring board.

According to the metal clad laminate and the wiring board of the present disclosure, as explained in the above-mentioned sections of the laminated uncured sheet and the laminated cured sheet, in the case of the metal-clad laminate and the wiring board, the unevenness of the inner wall surface of the resin sheet layer part or the unevenness of the inner wall surface of the cured resin sheet layer part in the through hole is filled with the thermoplastic resin, resulting in a relatively smooth surface. This prevents the penetration of the plating solution into the resin sheet layer or the cured resin sheet layer from the inner wall surface of the through hole. As a result, it is possible to obtain the metal-clad laminate and the wiring board with high electrical reliability.

As described above, the laminated uncured sheet of the present disclosure has the inner wall surface of the resin sheet layer part in the through hole covered with the thermoplastic resin composition. In the laminated cured sheet of the present disclosure, the inner wall surface of the cured resin sheet layer part in the through hole is covered with the thermoplastic resin composition. For this reason, the metal-clad laminate and the wiring board of the present disclosure formed by either the laminated uncured sheet or the laminated cured sheet also have unevenness on the inner wall surface of the resin sheet layer part or unevenness on the inner wall surface of the cured resin sheet layer in the through hole, both of which are filled with the thermoplastic resin. As a result, in the case of the metal-clad laminate and the wiring board, the penetration of the plating solution from the inner wall surface of the through hole into the resin sheet layer or into the cured resin sheet layer can be suppressed. Thus, the metal-clad laminate and the wiring board with excellent electrical reliability can be obtained.

EXAMPLES

Embodiments of the present disclosure are described below in detail with Examples, however, the embodiments of the present disclosure are not limited to these Examples.

(Sample 1)

A thermosetting resin mixture was obtained by mixing 50% by mass of thermosetting cyclic olefin copolymer (COC, manufactured by Mitsui Chemical Co., Ltd.), 25% by mass of silica (mean particle diameter of 1 µm) as an inorganic filler, and 25% by mass of ethylene-bis pentabromobenzene (mean particle diameter of 1 µm, manufactured by Albemarle Corporation, Brand Name: SAYTEX8010) as a flame retardant. A thermosetting resin varnish was prepared by mixing in a ratio of 80 parts by mass of xylene as a solvent to 100 parts by mass of the cyclic olefin copolymer used.

The resulting resin varnish was then applied to the base material (polyethylene terephthalate film) using a bar coater. After applying to the base material, it was dried at 150° C. for 4 minutes and then peeled off from the base material to obtain a sheet-like molded body (30 cm×30 cm, average thickness: about 28 µm). Several similar sheet-like molded bodies were prepared. The resulting molded body was in an uncured state.

The thermoplastic resin mixture was then obtained by mixing polystyrene (PS, manufactured by Japan Polystyrene Co., Ltd.) as a thermoplastic resin in the ratio of 10% by mass, 40% by mass of the above COC, 25% by mass of the above silica, and 25% by mass of the above flame retardant. The thermoplastic resin varnish was prepared by mixing in a ratio of 80 parts by mass of xylene as a solvent to 100 parts by mass of the total amount of polystyrene (PS) and COC used.

The resulting thermoplastic resin varnish was applied to one main surface of the obtained sheet-like molded body so as to achieve a thickness of 3 µm. Three sheet-like molded bodies with the thermoplastic resin varnish applied to one main surface were prepared. The three obtained sheet-like molded bodies were then overlapped so that the main surface applied with the thermoplastic resin varnish and the main surface not applied with the thermoplastic resin varnish were in contact with each other, and finally another sheet-like molded body not treated with the thermoplastic resin varnish was overlapped to obtain a laminated body. The resulting laminated body had a structure composed of the four layer sheet-like molded body (resin sheet layer) and the three layer thermoplastic resin varnish (resin layer) alternately laminated. The obtained laminated body was subjected to pressure treatment of 1 MPa at room temperature to obtain a laminated uncured sheet.

The obtained laminated uncured sheet was subjected to pressurized heat treatment to obtain a laminated cured sheet.

The pressurized heat treatment was carried out under pressurized heat conditions of 200° C. and 4 MPa for 120 minutes. The laminated cured sheet had the cured resin sheet layer with a thickness of 23 µm and the resin layer with a thickness of 2 µm, which were formed by curing the sheet-like molded body.

A part of the resin layer of the obtained laminated cured sheet was removed as a sample and heated in a sample hot plate. Because the sample melted upon heating, it was determined that the resin layer included the thermoplastic resin.

The copper-clad laminate was then obtained by the following methods. First, a copper foil having a thickness of 18 µm was laminated on both sides of the laminated uncured sheet. The laminated body on which the copper foil was laminated was subjected to pressurized heat treatment under pressurized heat conditions held at 200° C., 4 MPa for 120 minutes to obtain the copper-clad laminate.

The resulting copper-clad laminate was then laminated with four layers and subjected to pressurized heat treatment at 200° C. and 4 MPa, to obtain a wiring board.

(Sample 2)

A thermoplastic resin varnish was prepared by the same procedure as in Sample 1, except that the above PS was used at a ratio of 20% by mass and 30% by mass of the above COC. Except for the use of this thermoplastic resin varnish, a laminated cured sheet, a copper-clad laminate and a wiring board were obtained by the same procedure as in Sample 1. A part of the resin layer of the obtained laminated cured sheet was removed as a sample and heated on a sample hot plate. Because the sample melted upon heating, it was determined that the resin layer contained the thermoplastic resin.

(Sample 3)

A thermoplastic resin varnish was prepared by the same procedure as in Sample 1, except that the above PS was used in the ratio of 30% by mass and 20% by mass of the above COC. Except for the use of this thermoplastic resin varnish, a laminated cured sheet, a copper-clad laminate, and a wiring board were obtained by the same procedure as in Sample 1. A part of the resin layer of the obtained laminated cured sheet was removed as a sample and heated on a sample hot plate. Because the sample melted upon heating, it was determined that the resin layer contained the thermoplastic resin.

(Sample 4)

A thermoplastic resin varnish was prepared by the same procedure as in Sample 1, except that the above PS was used at a ratio of 40% by mass and 10% by mass of the above COC. Except for the use of this thermoplastic resin varnish, a laminated cured sheet, a copper-clad laminate, and a wiring board were obtained by the same procedure as in Sample 1. A part of the resin layer of the obtained laminated cured sheet was removed as a sample and heated on a sample hot plate. Because the sample melted upon heating, it was determined that the resin layer contained the thermoplastic resin.

(Sample 5)

A thermoplastic resin varnish was prepared by the same procedure as in Sample 1, except that the above PS was used at a ratio of 40% by mass and the above COC at a ratio of 60% by mass, and no silica and flame retardant were used. Except for the use of this thermoplastic resin varnish, a laminated cured sheet, a copper-clad laminate and, a wiring board were obtained by the same procedure as in Sample 1. A part of the resin layer of the obtained laminated cured sheet was removed as a sample and heated on a sample hot plate. Because the sample melted upon heating, it was determined that the resin layer contained the thermoplastic resin.

(Sample 6)

A thermoplastic resin varnish was prepared by the same procedure as in Sample 1, except that the above PS was used in the ratio of 30% by mass and 45% by mass of the above COC and 25% by mass of silica, and no flame retardants were used. Except for the use of this thermoplastic resin varnish, a laminated cured sheet, a copper-clad laminate, and a wiring board were obtained by the same procedure as in Sample 1. A part of the resin layer of the obtained laminated cured sheet was removed as a sample and heated on a sample hot plate. Because the sample melted upon heating, it was determined that the resin layer contained the thermoplastic resin.

(Sample 7)

A thermoplastic resin varnish was prepared by the same procedure as in Sample 1, except that the above PS was used in the ratio of 30% by mass and 45% by mass of the above COC and 25% by mass of the flame retardant, and no inorganic filler was used. Except for the use of this thermoplastic resin varnish, a laminated cured sheet, a copper-clad laminate, and a wiring board were obtained by the same procedure as in Sample 1. A part of the resin layer of the obtained laminated cured sheet was removed as a sample and heated on a sample hot plate. Because the sample melted upon heating, it was determined that the resin layer contained the thermoplastic resin.

(Sample 8)

A thermoplastic resin varnish was prepared by the same procedure as in sample 1, except that the above COC was used at a rate of 50% by mass and no thermoplastic resin was used. Except for the use of this thermoplastic resin varnish, a laminated cured sheet, a copper-clad laminate, and a wiring board were obtained by the same procedure as in Sample 1. A part of the resin layer of the obtained laminated cured sheet was removed as a sample and heated on a sample hot plate. Because heating carbonized the sample without melting it, but with its shape nearly intact, it was determined that the resin layer did not contain any thermoplastic resin.

First, the cross-sections of the wiring boards of prepared Samples 1 to 8 were photographed by a scanning electron microscope equipped with an analyzer. The total ratio of the inorganic filler and the flame retardant in the cross-sectional images was calculated as an area ratio, and the area ratio of the inorganic filler and the flame retardant was 10% or less in all samples.

Next, the flammability of each of the laminated cured sheets obtained from Samples 1 to 8 was evaluated in accordance with the UL94V flammability test. Specifically, test samples (12.5 mm×125 mm) cut from the laminated cured sheets were mounted vertically on the clamp. The flame contact was then conducted with a 20 mm flame from underneath the test sample and the time of extinction of the flame from the test sample was measured. Five test samples were tested and rated on three levels: V-not (flammable), V1 and V0 (flame resistance). The results are shown in Table 1.

Ten through holes (TH) with a diameter of 250 µm were then formed on each of the wiring boards obtained from Samples 1 to 8, and the TH were treated with electroless copper plating. After plating, it was verified whether the plating metal (copper) penetrated into the layer forming the laminated cured sheet from the inner wall surface of the TH. The length of the copper that penetrated the deepest into the layer (length from the inner wall surface of the TH) is shown in Table 1. In Table 1, for example, "20 µm" indicates that the length of copper penetrating most deeply was 20 µm.

In addition, the insulation reliability between the TH wall surfaces was evaluated for each of the wiring boards obtained from Samples 1 to 8. First, ten through holes (TH) with a diameter of 250 µm were formed on the obtained wiring board with an interval of 100 µm (the distance between TH wall surfaces is 100 µm), and the TH was treated with electroless copper plating. Then, the reliability test was conducted at a temperature of 130° C. and a humidity of 85% RH for 1000 hours under a voltage of 5.5 V. The similar test was conducted for the wiring board on which TH was formed by changing the distances between TH wall surfaces to 125 µm, 150 µm, 175 µm, and 250 µm. Table 1 shows the wall surface distance where the insulation reliability between the TH wall surfaces can be maintained. In Table 1, for example, "≥175 µm" indicates that the insulation reliability can be maintained if the distance between the wall surfaces is at least 175 µm.

TABLE 1

|  |  | Sample 1 | Sample 2 | Sample 3 | Sample 4 | Sample 5 | Sample 6 | Sample 7 | Sample 8 |
|---|---|---|---|---|---|---|---|---|---|
| Cured Resin Sheet Layer | COC (% by Mass) | 50 | 50 | 50 | 50 | 50 | 50 | 50 | 50 |
|  | Inorganic Filler (% by mass) | 25 | 25 | 25 | 25 | 25 | 25 | 25 | 25 |
|  | Flame Retardant (% by Mass) | 25 | 25 | 25 | 25 | 25 | 25 | 25 | 25 |
|  | Thickness | 23 µm | 23 µm | 23 µm | 23 µm | 23 µm | 23 µm | 23 µm | 23 µm |
| Resin Layer | PS (% by Mass) | 10 | 20 | 30 | 40 | 40 | 30 | 30 | 0 |
|  | COC (% by Mass) | 40 | 30 | 20 | 10 | 10 | 20 | 20 | 50 |
|  | Inorganic Filler (% by Mass) | 25 | 25 | 25 | 25 | 0 | 25 | 0 | 25 |
|  | Flame Retardant (% by Mass) | 25 | 25 | 25 | 25 | 0 | 0 | 25 | 25 |
|  | Thickness | 2 µm | 2 µm | 2 µm | 2 µm | 2 µm | 2 µm | 2 µm | 2 µm |
| Length of Plating Penetration (µm) |  | ≤20 | ≤15 | ≤10 | ≤5 | ≤5 | ≤5 | ≤5 | ≤25 |
| Distance between Wall Surfaces (µm) |  | ≥175 | ≥150 | ≥125 | ≥100 | ≥100 | ≥80 | ≥80 | ≥250 |
| Flame Resistance |  | V0 | V0 | V0 | V0 | V-not | V1 | V0 | V0 |

As shown in Table 1, Samples 1 to 7 show that the plated metal is less likely to penetrate into the layers when the plating process is applied. Furthermore, with respect to the insulation reliability, it shows that the insulation is maintained even when the interval between the THs is narrow (even when the distance between the TH wall surfaces is short).

DESCRIPTION OF THE REFERENCE NUMERALS

1 Laminated Uncured Sheet
2 Resin Sheet Layer
3 Resin Layer
31 Thermoplastic Resin Composition derived from the Resin Layer
4 Through Hole (Through Hole)
5 Inner Wall Surface of the Through Hole

The invention claimed is:

1. A laminated uncured sheet comprising a structure in which resin sheet layers and resin layers are alternately laminated, and a through hole penetrating in the laminating direction is formed, wherein
the resin sheet layers are formed with a thermosetting resin composition containing a thermosetting resin as a main component,
the resin layers are formed with a thermoplastic resin composition containing a thermoplastic resin,
the thermoplastic resin composition is adhered to the inner wall surface of the resin sheet layer part in the through hole penetrating from an upper surface of the structure to a lower surface of the structure, and
a relative value of the thickness of each of the resin layers is 4 to 14 when the thickness of each of the resin sheet layers is set of 100.

2. The laminated uncured sheet according to claim 1, wherein at least one of the thermosetting resin composition or the thermoplastic resin composition further contains at least one of an inorganic filler or a flame retardant.

3. The laminated uncured sheet according to claim 1, wherein a content ratio of an inorganic filler and a flame retardant in the resin layers is less than a content ratio of an inorganic filler and a flame retardant in the resin sheet layers.

4. A laminated cured sheet comprising a structure in which cured resin sheet layers and resin layers are alternately laminated, and a through hole penetrating in the laminating direction is formed, wherein
the cured resin sheet layers are formed with a thermosetting resin composition containing a thermosetting resin as a main component,
the resin layers are formed with a thermoplastic resin composition containing a thermoplastic resin,
the thermoplastic resin composition is adhered to the inner wall surface of the cured resin sheet layer part in the through hole penetrating from an upper surface of the structure to a lower surface of the structure, and a relative value of the thickness of each of the resin layers is 4 to 14 when the thickness of each of the resin sheet layers is set to 100.

5. The laminated cured sheet according to claim 4, wherein at least one of the thermosetting resin composition or the thermoplastic resin composition further contains at least one of an inorganic filler or a flame retardant.

6. The laminated cured sheet according to claim 4, wherein a content ratio of an inorganic filler and a flame retardant in the resin layers is less than a content ratio of an inorganic filler and a flame retardant in the cured resin sheet layers.

7. A metal-clad laminate comprising the laminated cured sheet according to claim 4, and a metal foil laminated on at least one side of the laminated cured sheet.

8. A wiring board comprising an insulating layer and conductor layers disposed on a main surface of the insulating layer, wherein the insulating layer is composed of the laminated cured sheet according to claim 4.

\* \* \* \* \*